(12) United States Patent
Nagano et al.

(10) Patent No.: US 7,572,068 B2
(45) Date of Patent: Aug. 11, 2009

(54) LASER MODULE HAVING DETACHABLE TRANSPARENT MEMBER COVERING LIGHT-OUTPUT WINDOW

(75) Inventors: Kazuhiko Nagano, Kanagawa-ken (JP); Shinichiro Sonoda, Kanagawa-ken (JP); Masami Hatori, Kanagawa-ken (JP); Hideo Miura, Kanagawa-ken (JP); Shinichi Shimotsu, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/393,836

(22) Filed: Mar. 31, 2006

(65) Prior Publication Data

US 2006/0251144 A1 Nov. 9, 2006

(30) Foreign Application Priority Data

Mar. 31, 2005 (JP) ............................. 2005-103782

(51) Int. Cl.
  *G02B 6/36* (2006.01)
(52) U.S. Cl. .............................. 385/93; 385/88; 385/90; 385/92; 385/94
(58) Field of Classification Search ................... 372/34, 372/35, 36; 382/88–94
  See application file for complete search history.

(56) References Cited

U.S. PATENT DOCUMENTS 5,388,171 A * 2/1995 Michikoshi et al. ........... 385/36
5,787,215 A * 7/1998 Kuhara et al. .................. 385/88
6,721,511 B1 * 4/2004 Tatsuno et al. ............... 398/141
2002/0090172 A1 * 7/2002 Okazaki et al. ................ 385/27

FOREIGN PATENT DOCUMENTS

| JP | 2-81008 A | 3/1990 |
| JP | 11-54852 A | 2/1999 |
| JP | 2004-252425 A | 9/2004 |
| JP | 2004-253783 A | 9/2004 |

OTHER PUBLICATIONS

S. Nakamura, "InGaN-Based Blue Laser Diodes," IEEE J. of Selected Topics in Quantum Electronics, vol. 3, No. 3, pp. 712-718, Jun. 1997.*

* cited by examiner

*Primary Examiner*—Minsun Harvey
*Assistant Examiner*—Xnning Niu
(74) *Attorney, Agent, or Firm*—Sughrue Mion, PLLC (57) ABSTRACT

A laser module includes: a chassis having a light-output window from which one or more laser beams are outputted; a hermetically sealed package which is fixed to the chassis; one or more semiconductor laser elements which are arranged in the hermetically sealed package, and emit the one or more laser beams; a transparent member which is arranged to cover the light-output window; an optical fiber which has a light-entrance end face, and is arranged outside the chassis so that the light-entrance end face is in contact with the transparent member; and an optical condensing system which is arranged inside the chassis, and makes the one or more laser beams pass through the transparent member and be condensed on the light-entrance end face. The transparent member and the optical fiber are detachably attached to the chassis.

8 Claims, 6 Drawing Sheets

LASER MODULE HAVING DETACHABLE TRANSPARENT MEMBER COVERING LIGHT-OUTPUT WINDOW

BACKGROUND OF THE INVENTION

1. Field of the Invention

The present invention relates to a laser module having one or more semiconductor laser elements, an optical fiber, and an optical injection system which couples one or more laser beams emitted from the semiconductor laser elements, to an end face of the optical fiber.

2. Description of the Related Art

Conventionally, the laser modules having the following construction are known as the pigtail-type laser modules in the field of optical communications. The pigtail-type laser modules are constituted by a semiconductor laser element contained in a package, an optical fiber being fixed to the package and having an end (light-entrance end) which appears inside the package, and an optical condensing system which couples a laser beam emitted from the semiconductor laser element, to a light-entrance end face of the optical fiber.

In the case where short-wavelength lasers in the blue or ultraviolet wavelength range or high-output-power lasers are used in the above laser modules, contaminants such as organic materials are likely to deposit on surfaces of optical components at which the optical power density is high, and cause troubles such as the lowering of the transmittance or breakage of the optical components. It is known that dust suspended in the air can deposit on incident surfaces of optical components (i.e., end faces of optical components on which laser beams are incident) by the dust collection effect, and products of reaction between the laser beams and organic materials existing around the end faces or vaporized in the air can also deposit on the end faces, as described in Japanese Unexamined Patent Publication No. 11(1999)-054852.

Japanese Unexamined Patent Publication Nos. 2004-252425 and 2004-253783 disclose techniques for preventing deposition of contaminants on end faces of optical components. According to the technique disclosed in Japanese Unexamined Patent Publication No. 2004-252425, a light-entrance end face of an optical fiber is held in close contact with an outer surface of a glass window of a package. In addition, according to the technique disclosed in Japanese Unexamined Patent Publication No. 2004-253783, a light-entrance end face of an optical fiber is protected by hermetically sealing the light-entrance end face or holding a transparent member (such as a glass block) in close contact with the light-entrance end face.

Further, Japanese Unexamined Patent Publication No. 2(1990)-081008 and U.S. Pat. No. 5,388,171 disclose laser modules which have similar constructions to the constructions disclosed in Japanese Unexamined Patent Publication Nos. 2004-252425 and 2004-253783, although the purposes of the techniques disclosed in Japanese Unexamined Patent Publication No. 2(1990)-081008 and U.S. Pat. No. 5,388,171 are different from the purposes of the techniques disclosed in Japanese Unexamined Patent Publication Nos. 2004-252425 and 2004-253783.

However, the techniques disclosed in the above patent publications have the following problems.

Japanese Unexamined Patent Publication No. 2004-252425 discloses a structure wherein a receptacle capable of receiving a ferrule is fixed outside a hermetically sealed package containing semiconductor lasers and lenses, and an optical fiber the tip of which is inserted into the ferrule is connected with the receptacle by using a connector which can fit into the receptacle. However, in this structure, the semiconductor lasers and the lenses are contained in the hermetically sealed package. Therefore, the size of the package increases. Generally, the hermetically sealed package is expensive, and the cost of the hermetically sealed package further increases when the hermetically sealed package is large. In addition, in the above structure, the ferrule is held in contact with the light-output window of the hermetically sealed package. Therefore, it is necessary that the glass window have a hermetically sealing function. In addition, since the glass window is pressed when the ferrule is kept in contact with the glass window, it is necessary to increase the strength of the glass and the sealing portion in order to maintain the hermetically sealing function against the pressure. However, the cost increases with the increase in the strength of the glass and the sealing portion.

On the other hand, as mentioned before, Japanese Unexamined Patent Publication No. 2004-253783 discloses a structure for preventing deposition of contaminants on the light-entrance end face of the optical fiber by fixing a transparent member to the light-entrance end face or holding the transparent member in close contact with the light-entrance end face. However, the transparent member is fixed to a chassis or a support, or to a tip of the optical fiber. Therefore, it is impossible to replace the transparent member. The constructions disclosed in Japanese Unexamined Patent Publication No. 2(1990)-081008 and U.S. Pat. No. 5,388,171 also have similar problems.

Further, if the constructions disclosed in the above patent publications are modified so that the optical fiber can be detached from and reattached to the glass window or the transparent member, minute dust or contaminants can be caught between the ferrule and the glass window or between the ferrule and the transparent member when connection and disconnection are repeated, so that the physical contact between the ferrule and the glass window or between the ferrule and the transparent member becomes insufficient, and the light-entrance end face of the optical fiber can be contaminated.

SUMMARY OF THE INVENTION

The present invention has been developed in view of the above circumstances.

The object of the present invention is to provide a laser module which has long-term reliability, and can be produced at low cost.

(I) In order to accomplish the above object, the present invention is provided. According to the present invention, there is provided a laser module comprising: a chassis having a light-output window from which one or more laser beams are outputted; a hermetically sealed package which is fixed to the chassis; one or more semiconductor laser elements which are arranged in the hermetically sealed package, and emit the one or more laser beams; a transparent member which is arranged to cover the light-output window; an optical fiber which has a light-entrance end face, and is arranged outside the chassis so that the light-entrance end face is in contact with the transparent member; and an optical condensing system which is arranged inside the chassis, and makes the one or more laser beams pass through the transparent member and be condensed on the light-entrance end face. The transparent member and the optical fiber are detachably attached to the chassis.

Preferably, the laser module according to the present invention may also have one or any possible combination of the following additional features (i) to (x).

(i) The laser module according to the present invention may further comprise a ferrule into which a near-tip portion of the optical fiber including the light-entrance end face is inserted, and the chassis may have a receptacle which receives the ferrule.

(ii) The chassis may have a holder portion in a vicinity of the light-output window, where the holder portion holds the transparent member.

(iii) The one or more laser beams may have an optical power density of 10 W/mm$^2$ or lower at a surface of said transparent member on which the one or more laser beams are incident.

(iv) The one or more semiconductor laser elements may have an oscillation wavelength of 350 to 500 nm. For example, GaN-based compound semiconductor lasers can be used.

(v) The one or more semiconductor laser elements may be a single-transverse-mode semiconductor laser element, a transverse-mode broad-area semiconductor laser element, an array of single-transverse-mode semiconductor laser elements, an array of transverse-mode broad-area semiconductor laser elements, or a mixed array of at least one single-transverse-mode single semiconductor laser element and at least one transverse-mode broad-area semiconductor laser element.

(II) The laser modules according to the present invention have the following advantages.

(a) In the laser module according to the present invention, the light-entrance end face of the optical fiber (at which the optical power density is very high during operation of the laser module) is held in contact with the transparent member so that the light-entrance end face is protected from the atmosphere. Therefore, contaminants such as organic materials do not deposit on the light-entrance end face.

(b) Since the optical fiber is detachably attached to the chassis, dust can be caught between the light-entrance end face and the chassis. However, since the transparent member can also be detached from the chassis, it is possible to easily clean and replace the transparent member, and sufficiently maintain the effect of protecting the light-entrance end face of the optical fiber. When the laser module according to the present invention is used in adverse environment, contaminants can also deposit on a beam-incident surface of the transparent member. However, it is possible to stably use the laser module for a long time by cleaning and replacing the transparent member.

(c) Since the laser module according to the present invention can be realized by using a relatively inexpensive, hermetically sealed package, it is possible to produce the laser module at low cost.

(d) In the case where the tip of the optical fiber including the light-entrance end face of the optical fiber is inserted into a ferrule, and the chassis comprises a receptacle which receives the ferrule, it is possible to easily adjust axial alignment with high precision when the optical fiber is connected to the chassis.

(e) In the case where the one or more semiconductor laser elements emit laser light at the wavelength of 350 to 500 nm, the high energy of the laser light promotes deposition of contaminants on surfaces at which the optical power density is high. Therefore, in such a case, the present invention is particularly effective in prevention of the deposition of contaminants.

DESCRIPTION OF PREFERRED EMBODIMENTS

Preferred embodiments of the present invention are explained in detail below with reference to drawings. In the drawings, equivalent elements and constituents are indicated by the same reference numbers even in drawings for different embodiments, and descriptions of the equivalent elements or constituents are not repeated in the following explanations unless necessary.

First Embodiment

Figure 1:
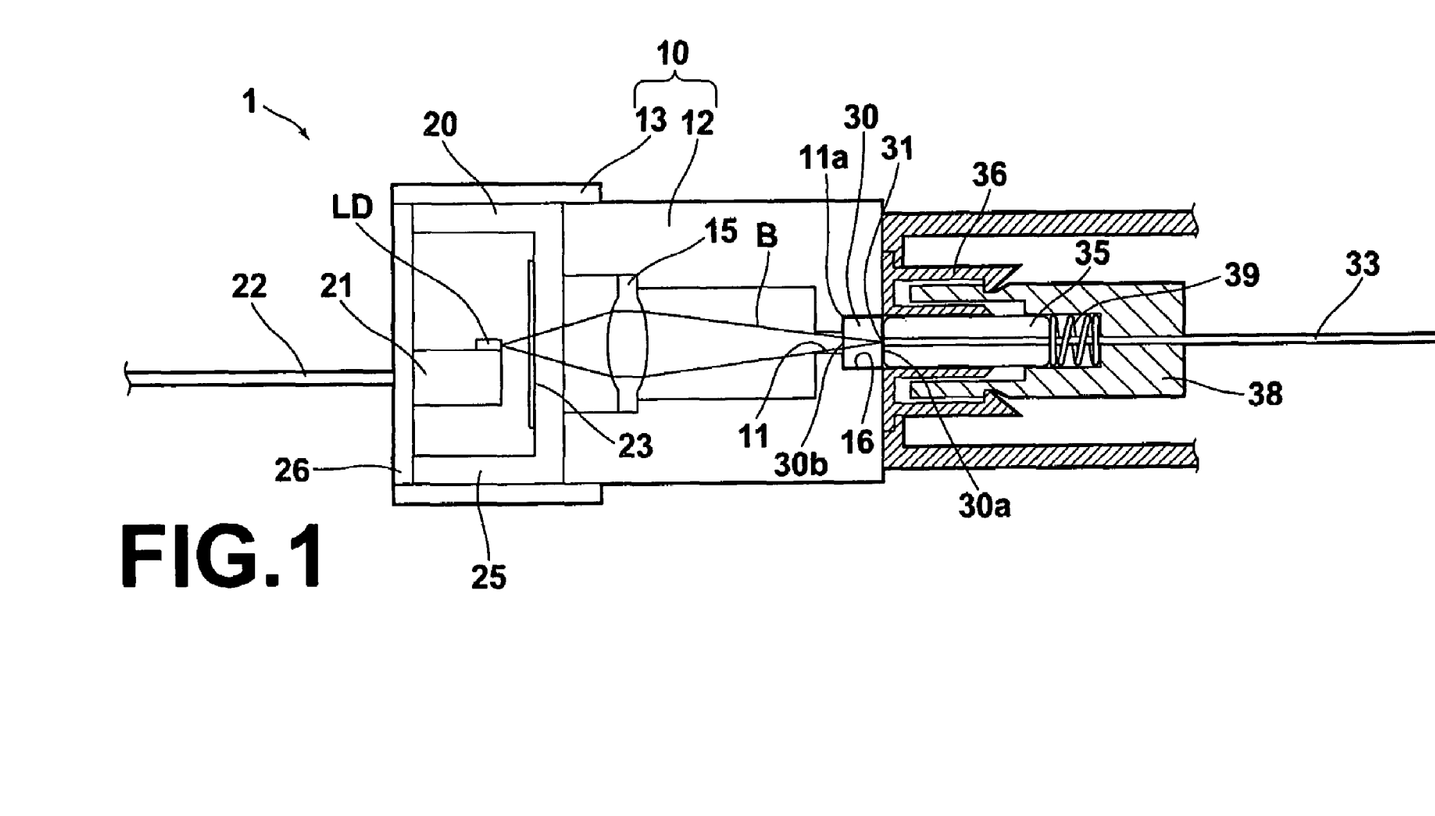
FIG. 1 is a side view, partly in cross section, of a laser module according to a first embodiment of the present invention.

The first embodiment of the present invention is explained below. FIG. 1 is a side view, partly in cross section, of a laser module according to the first embodiment of the present invention, and FIG. 2 is a side view, partly in cross section, of the laser module according to the first embodiment when a connector is detached.

Figure 2:
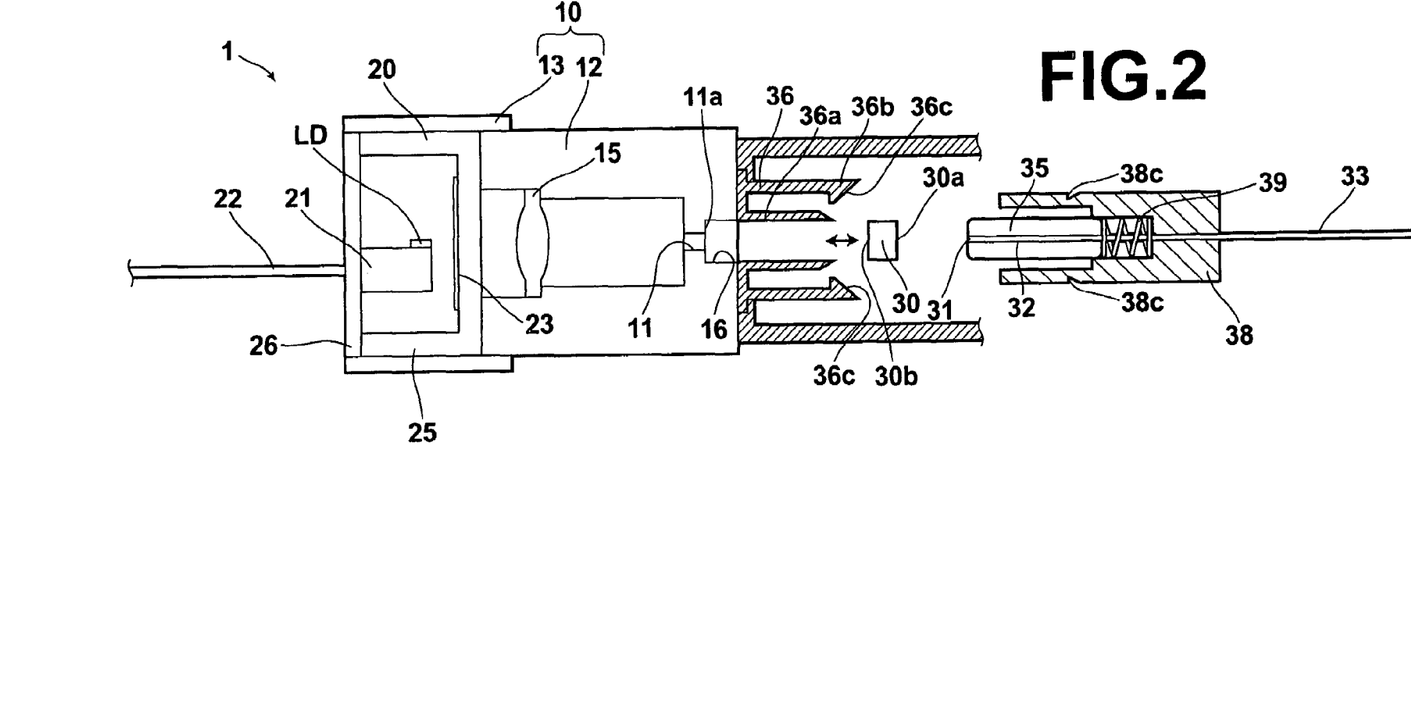
FIG. 2 is a side view, partly in cross section, of the laser module according to the first embodiment when a connector is detached.

As illustrated in FIGS. 1 and 2, the laser module 1 according to the first embodiment comprises a chassis 10, a CAN package 20, a condensing lens 15, a transparent member 30, and an optical fiber 33. The chassis 10 is constituted by a first lens-barrel 12 and a second lens-barrel 13. The first lens-barrel 12 has a light-output window 11, and is fitted into and fixed to the second lens-barrel 13. A semiconductor laser element LD is mounted in the CAN package 20. The CAN package 20 is hermetically sealed, press fitted into the second lens-barrel 13 from one end of the second lens-barrel 13, and fixed to the second lens-barrel 13. The condensing lens 15 is held within the first lens-barrel 12. The transparent member 30 is fitted into the first lens-barrel 12 so as to cover the light-output window 11. The optical fiber 33 has a light-entrance end face 31 from which a laser beam B emitted from the semiconductor laser element LD enters, and a near-tip portion 32 of the optical fiber 33 including the light-entrance end face 31 is inserted into a ferrule 35.

The semiconductor laser element LD (for example, a broad-area semiconductor laser element with output power of 250 mW) is arranged on a block 21 fixed in the CAN package 20. In addition, wirings 22 for supplying driving current to the semiconductor laser element LD are led out through an opening to the outside of the CAN package 20, where the opening is formed in a first wall of the CAN package 20. Further, a light-output window 23 is formed in a second wall of the CAN package 20 opposite to the first wall.

The chassis 10 has a transparent-member holder 16 for receiving and holding the transparent member 30. The transparent member 30 is a cylindrical glass block, and each of the light-output window 11 and the transparent-member holder 16 has a cylindrical shape. The transparent-member holder 16 has a diameter slightly greater than the diameter of the light-output window 11 so that a steplike change 11a in the diameter between the light-output window 11 and the transparent-member holder 16 stops the movement of the transparent member 30 in the optical-axis direction.

A receptacle 36 which is arranged to receive the ferrule 35 is attached to the chassis 10 so as to surround the transparent-member holder 16. A connector 38 is fitted on the near-tip portion 32 of the optical fiber 33 which is inserted in the ferrule 35, where the connector 38 is so formed that the connector 38 can be fitted into the receptacle 36. The receptacle 36 has an inner sleeve 36a and an outer sleeve 36b. The ferrule 35 is received by the inner sleeve 36a in the receptacle 36. The outer sleeve 36b has a means for engagement 36c, and the connector 38 also has a means for engagement 38c. The means for engagement 36c and 38c are arranged to engage with each other.

The connector 38 has a spring 39 for pressing the ferrule 35 against a contact surface 30a of the transparent member 30 when the connector 38 is fitted into the receptacle 36. Thus, when the connector 38 is connected with the receptacle 36, the ferrule 35 applies a predetermined pressure to the transparent member 30 through the spring 39 so that the light-entrance end face 31 of the optical fiber 33 is brought into contact with the contact surface 30a of the transparent member 30. At this time, the position of the transparent member 30 in the optical-axis direction is determined by the aforementioned steplike change 11a in the diameter between the light-output window 11 and the transparent-member holder 16 and the above pressure.

As illustrated in FIG. 2, the connector 38 can be detached from and reattached to the receptacle 36, and the transparent member 30 (with which the light-entrance end face 31 of the optical fiber 33 is held in contact) can also be can be detached from and reattached to the receptacle 36. Even when contaminants are deposited on an incident surface 30b of the transparent member 30 on which the laser beam B is incident, or when dust and the like is deposited on surfaces located between the transparent member 30 and the optical fiber 33, after a long run, it is possible to easily clean or replace the transparent member 30. At this time, the transparent member 30 can be detached from or inserted in the receptacle 36 through the inner sleeve 36a.

The laser module 1 according to the first embodiment can be assembled as follows.

First, the semiconductor laser element LD is mounted on the block 21 in the round CAN package 20 with a brazing material. Then, a cap 25 having the aforementioned light-output window 23 is fixed to a block-fixing member 26 by resistance welding, and the CAN package 20 is degassed in order to remove volatile materials from the inside of the CAN package 20. After the CAN package 20 is filled with inert gas, the CAN package 20 is hermetically sealed.

Next, the hermetically sealed CAN package 20 is press-fitted into the second lens-barrel 13 from one end of the second lens-barrel 13, and fixed to the second lens-barrel 13. At this time, it is possible to fix the CAN package 20 by YAG welding, or by using an adhesive or solder.

the first lens-barrel 12 in which the condensing lens 15 is fixed in advance can be fitted into the second lens-barrel 13 in which the CAN package 20 is fixed in advance, by sliding the first lens-barrel 12 in the optical-axis direction. then, the position of the second lens-barrel 13 with respect to the first lens-barrel 12 is adjusted so that the laser beam B emitted from the semiconductor laser element LD is condensed in the joining surface 30a of the transparent member 30. Thereafter, the first lens-barrel 12 is fixed to the second lens-barrel 13 by YAG welding, or by using an adhesive, solder, or the like. Thus, the chassis 10 is formed of the first lens-barrel 12 and the second lens-barrel 13.

The receptacle 36 is fixed on the first lens-barrel 12 (constituting the chassis 10) so that the receptacle 36 surrounds the light-output window 11, and the laser beam B condensed by the condensing lens 15 most efficiently enters the optical fiber 33. Therefore, the position at which the laser beam B converges and the position of the inner sleeve 36a in the receptacle 36 do not move. Thus, even when the optical fiber 33 or the semiconductor laser element LD is replaced, the precision in the above positions is maintained, so that it is possible to achieve high coupling efficiency.

In the case where the internal diameter of the inner sleeve 36a in the receptacle 36 has the precision of 2 micrometers or less, and the outer diameter of the ferrule 35 has the precision of 1 micrometer or less, it is possible to achieve the precision of 3 micrometers or less in the position at which the laser beam B converges and the position of the light-entrance end face 31 of the optical fiber 33 when the optical fiber 33 is mounted.

In the laser module 1 according to the present embodiment, the laser beam B emitted from the semiconductor laser element LD is outputted through the light-output window 23 of the CAN package 20, and condensed by the condensing lens 15. Then, the condensed laser beam B passes through the light-output window 11 and the transparent member 30, enters the optical fiber 33 through the light-entrance end face 31, and is outputted from a light-output end face (not shown) of the optical fiber 33.

Since the CAN package 20 is degassed (for removal of volatile materials from the inside of the CAN package 20) and hermetically sealed, it is possible to suppress deposition of contaminants on an end face of the semiconductor laser element. In addition, since the light-entrance end face 31 of the optical fiber 33 is brought into contact with the transparent member 30 and fixed by pressure, the light-entrance end face 31 is protected by the transparent member 30, so that contaminants do not deposit on the light-entrance end face 31. Further, as mentioned before, even when the transparent member 30 is contaminated, the transparent member 30 can be easily cleaned or replaced. That is, the laser module 1 has long-term reliability.

Furthermore, the CAN package 20 used for hermetically sealing the semiconductor laser element may be a commercially available CAN package, which is not expensive. In addition, since the chassis 10 is not required to be hermetically sealed, the chassis 10 can be constructed at low cost. Therefore, it is possible to produce the laser module 1 according to the present embodiment at low cost.

Moreover, when the semiconductor laser element is driven so that the optical power density at the incident surface 30b of the transparent member 30 does not exceed 10 W/mm$^2$, deposition of contaminants such as organic materials on the incident surface 30b is suppressed. Therefore, it is possible to reduce the frequency of cleaning or replacement of the transparent member 30, and reduce the time and cost for the cleaning or replacement. In addition, when the semiconductor laser element is driven so that the optical power density at the incident surface 30b of the transparent member 30 does not exceed 10 W/mm$^2$, deposition of contaminants on the incident surface 30b is so suppressed that it is possible to achieve the effect of increasing the lifetime of the laser module even in the case where the transparent member 30 is undetachably fixed and cannot be replaced.

Figure 3:
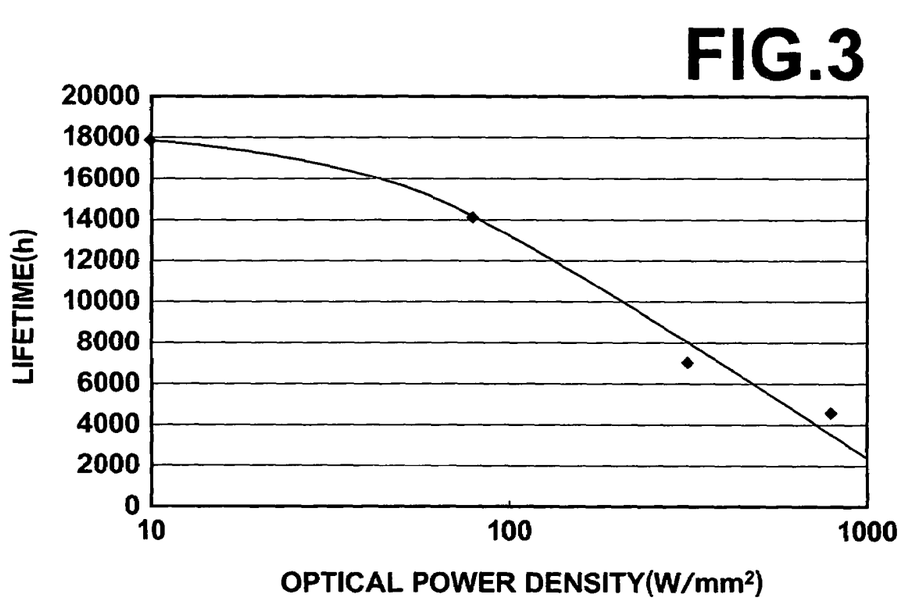
FIG. 3 is a graph indicating a relationship between the lifetime and the optical power density at the light-entrance end face.

FIG. 3 is a graph indicating a relationship between the lifetime and the optical power density at the incident surface 30b of the transparent member 30 in the case where the transparent member 30 is not replaced. In FIG. 3, the lifetime is defined as the time which elapses until the output power of laser module falls down to 60% of the initial output power level. As indicated in FIG. 3, the lifetime is 180,000 hours when the optical power density is 10 W/mm$^2$, and decreases with increase in the optical power density. Therefore, it is possible to consider that the lifetime of 180,000 hours or more can be achieved when the optical power density is 10 W/mm$^2$ or lower. The lifetimes of the laser modules as disclosed in Japanese Unexamined Patent Publication No. 2004-253783 (in which the light-entrance end face of the optical fiber is hermetically sealed so that the light-entrance end face is not exposed to the atmosphere) are approximately 20,000 hours. That is, when the laser modules have the construction according to the present embodiment, the reduction in the lifetime from the lifetime achieved in the case where the light-entrance end face of the optical fiber is hermetically sealed can be suppressed to 10% or less.

For example, it is possible to arrange the laser module to have output power of 10 W/mm$^2$ or lower as indicated below.

In the first example, the optical fiber has a numerical aperture (NA) of 0.22, the numerical aperture of the condensed beam incident on the optical fiber is 0.2, the output power of the semiconductor laser element is 250 mW, and the transparent member is made of glass having a refractive index of 1.5. At this time, the condensed beam has a numerical aperture of 0.127 in the transparent member. In the case where the transparent member is a glass plate with a thickness of 0.7 mm, the optical power density of the laser beam at the incident surface of the glass plate becomes 10 W/mm$^2$. Further, In the case where the thickness of the glass plate is 0.7 mm or greater, it is possible to make the optical power density of the laser beam at the incident surface of the glass plate equal to or lower than 10 W/mm$^2$. Therefore, it is possible to sufficiently suppress contamination of the incident surface of the glass plate.

In the second example, the output power of the semiconductor laser element is 1 W, and the other conditions are identical to the first example. In this case, the optical power density of the laser beam at the incident surface of the glass plate becomes 10 W/mm$^2$ when the transparent member is a glass plate having a refractive index of 1.5 and a thickness of 1 mm. Further, in the case where the thickness of the glass plate is 1 mm or greater, it is possible to make the optical power density of the laser beam at the incident surface of the glass plate equal to or lower than 10 W/mm$^2$. Therefore, it is possible to sufficiently suppress contamination of the incident surface of the glass plate, and realize a laser module having high aging reliability.

Second Embodiment

Figure 4:
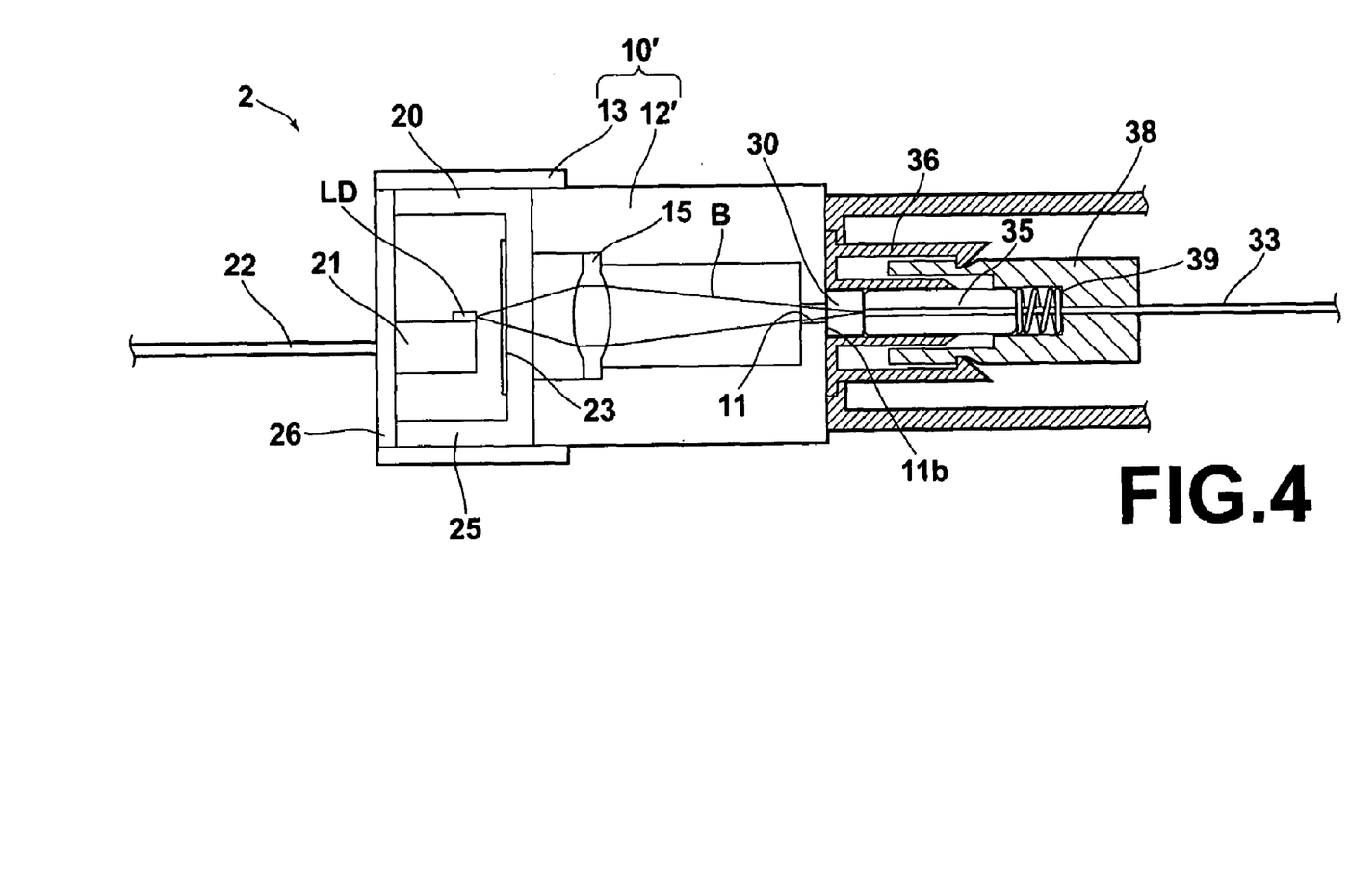
FIG. 4 is a side view, partly in cross section, of a laser module according to a second embodiment of the present invention.
Figure 5:
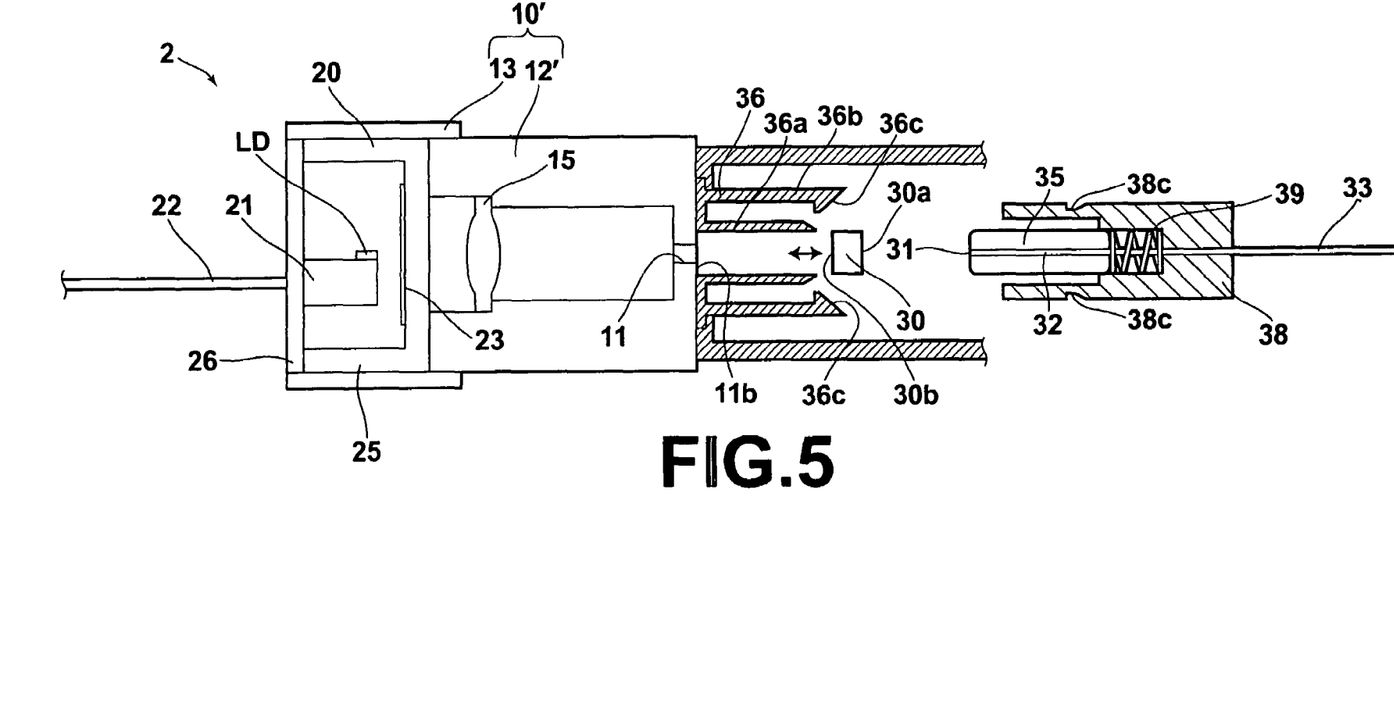
FIG. 5 is a side view, partly in cross section, of the laser module according to the second embodiment when a connector is detached.

The second embodiment of the present invention is explained below. FIG. 4 is a side view, partly in cross section, of a laser module according to the second embodiment of the present invention, and FIG. 5 is a side view, partly in cross section, of the laser module according to the second embodiment when a connector is detached.

The laser module 2 according to the second embodiment is different from the laser module 1 the first embodiment in that the chassis 10' (the first lens-barrel 12') does not have a transparent-member holder for receiving the transparent member 30.

The receptacle 36 is fixed on the first lens-barrel 12' (constituting the chassis 10') so that the receptacle 36 surrounds the light-output window 11. The transparent member 30 is detachably held in a near-end portion of the inner sleeve 36a in the receptacle 36 so that the transparent member 30 covers the outer end of the light-output window 11 (i.e., the end of the light-output window 11 on the outer side of the chassis 10').

When the connector 38 is connected with the receptacle 36 after the transparent member 30 is inserted in the near-end portion of the inner sleeve 36a, the spring 39 (which is built in the connector 38) presses the ferrule 35 against the transparent member 30. Therefore, the transparent member 30 is held in contact with a window frame 11b in the chassis 10', so that the position of the transparent member 30 in the optical-axis direction is determined and unchanged.

As illustrated in FIG. 5, the connector 38 can be detached from and reattached to the receptacle 36, and the transparent member 30 can also be detached from and reattached to the receptacle 36, as in the first embodiment. Therefore, even when contaminants are deposited on an incident surface 30b of the transparent member 30 on which the laser beam B is incident, or when dust and the like is deposited on surfaces located between the transparent member 30 and the optical fiber 33, after long-time operation of the laser module, it is possible to easily clean or replace the transparent member 30.

In addition, since the receptacle 36 is fixed to the chassis 10' as in the first embodiment, the position at which the laser beam B converges and the position of the inner sleeve 36a in the receptacle 36 do not move. Thus, even when the optical fiber 33 or the semiconductor laser element LD is replaced, the precision in the above positions is maintained, so that it is possible to achieve high coupling efficiency.

In the case where the internal diameter of the inner sleeve 36a in the receptacle 36 has the precision of 2 micrometers or less, and the outer diameter of the ferrule 35 has the precision of 1 micrometer or less, it is possible to achieve the precision of 3 micrometers or less in the position at which the laser beam B converges and the position of the light-entrance end face 31 of the optical fiber 33.

Third Embodiment

Figure 6:
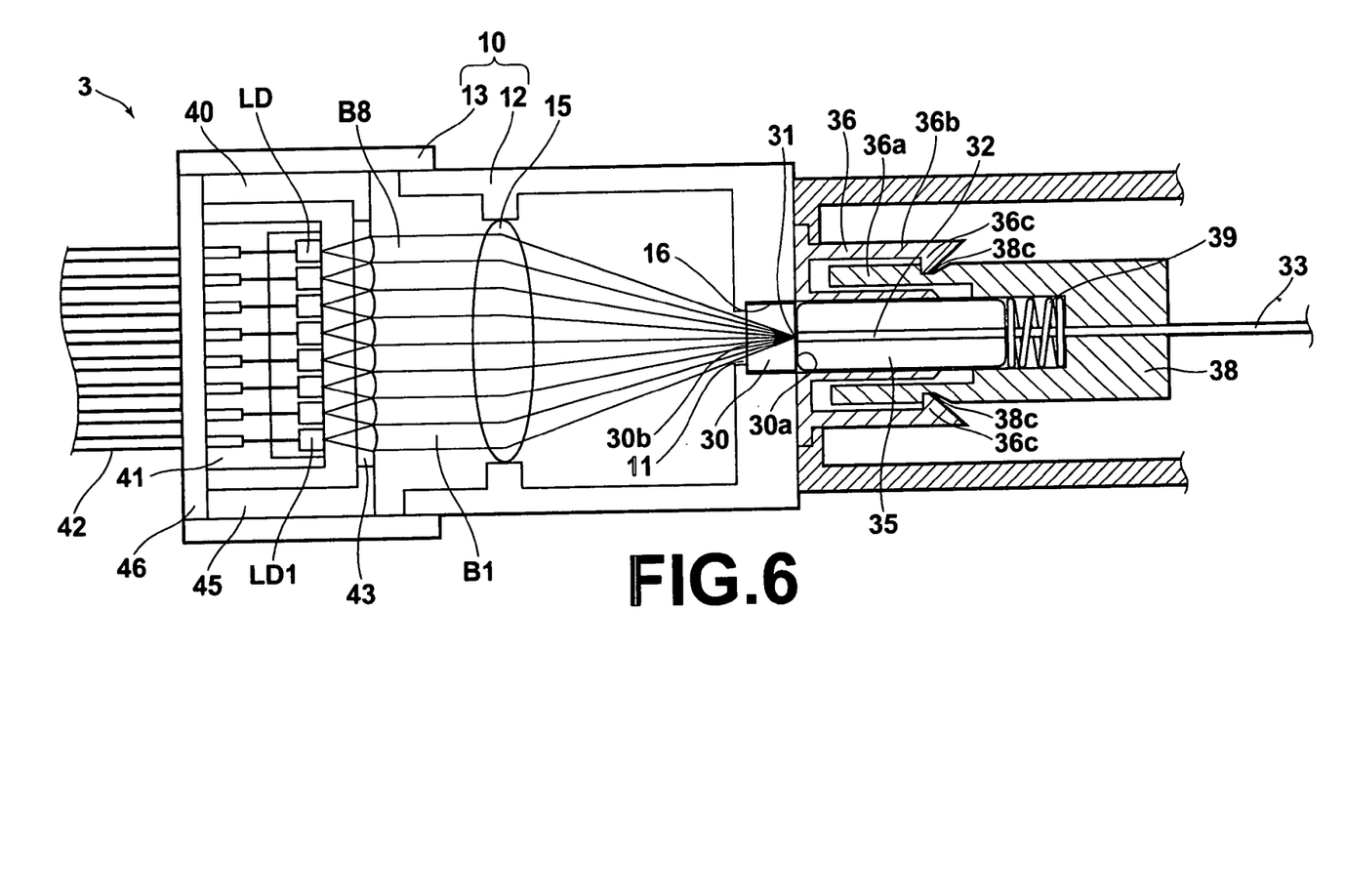
FIG. 6 is a plan view of a laser module according to a third embodiment of the present invention.

The third embodiment of the present invention is explained below. FIG. 6 is a schematic plan view of a laser module according to the third embodiment of the present invention.

As illustrated in FIG. 6, the laser module 3 according to the third embodiment comprises eight GaN-based semiconductor laser elements LD1 to LD8 in the CAN package 40. The semiconductor laser elements LD1 to LD8 emit divergent laser beams B1 to B8. In addition, a light-output window is formed in a first wall of the CAN package 40. Specifically, the light-output window is realized by a collimator-lens array 43. In FIG. 6, the collimator-lens array 43 and the condensing lens 15 are schematically illustrated, and for simple illustration, only the semiconductor laser elements at both ends and the corresponding laser beams are denoted by the references B1, B8, LD1, and LD8.

The semiconductor laser elements LD1 to LD8 are arranged on a block 41 in the CAN package 40, wirings 42 for supplying driving current to the semiconductor laser elements LD1 to LD8 are led out through an opening to the outside of the CAN package 40, where the opening is formed in a second wall of the CAN package 40, which is opposite to the aforementioned first wall. As in the first embodiment, a cap 45 having the light-output window 43 is fixed to a block-fixing member 46 by resistance welding, and the CAN package 40 is hermetically sealed.

In the laser module 3, the collimator-lens array 43 and the condensing lens 15 constitute an optical condensing system, and the optical condensing system and the optical fiber 33 constitute an optical combining system. That is, the divergent laser beams B1 to B8 emitted from the semiconductor laser elements LD1 to LD8 are collimated by the collimator-lens array 43, and condensed by the condensing lens 15 so as to converge at the light-entrance end face 31 of the optical fiber 33. Then, the condensed laser beams B1 to B8 enter the core of the optical fiber 33, propagate through the optical fiber 33, and are combined into a single laser beam B, which is outputted from a light-output end face (not shown) of the optical fiber 33.

According to the third embodiment, the light-entrance end face 31 is protected by pressing the tip end of the optical fiber 33 against the transparent member 30 so as to hold the light-entrance end face 31 in contact with the transparent member 30. Since the divergent laser beams B1 to B8 emitted from the semiconductor laser elements LD1 to LD8 converge at the light-entrance end face 31 of the optical fiber 33, the optical power density at the light-entrance end face 31 becomes very high. Therefore, the structure in which the light-entrance end face 31 is held in contact with the transparent member 30 by the pressure is effective in preventing deposition of contaminants such as organic materials on the light-entrance end face 31. For a similar reason, the optical power density at the incident surface 30b of the transparent member 30 is also high, so that contaminants are likely to deposit on the incident surface 30b. Therefore, the facility of replacement of the transparent member 30 is effective in preventing deposition of contaminants on the incident surface 30b of the transparent member 30.

Although the eight semiconductor laser elements LD1 to LD8 used in the third embodiment are single-cavity semiconductor laser elements, alternatively one or more multi-cavity semiconductor laser chips may be used. For example, four double-cavity semiconductor laser elements or a single multi-cavity semiconductor laser chip having eight cavities may be used. Further, the semiconductor laser elements LD1 to LD8 may not be GaN-based semiconductor laser elements.

Additional Matters (1) Each semiconductor laser element used in each embodiment may be a semiconductor laser element which has an emission region with a width smaller than 2 micrometers and outputs a laser beam in a single transverse mode, or a semiconductor laser element which has an emission region with a width equal to or greater than 2 micrometers and outputs a broad laser beam. In the case where a plurality of semiconductor laser elements are mounted, the plurality of semiconductor laser elements may be a mixture of at least one single-transverse-mode semiconductor laser element and at least one broad-area semiconductor laser element.

(2) The one or more semiconductor laser elements used in each embodiment may not be GaN-based semiconductor laser elements. However, in the case where the one or more semiconductor laser elements used in each embodiment emit high-energy laser beams as the GaN-based semiconductor laser elements (which emit laser light with the wavelength of 500 nm or shorter), the optical power density at the laser-emission end faces of the semiconductor laser elements or the light-entrance end face of the optical fiber becomes very high, so that contaminants such as organic materials are likely to deposit on the laser-emission end faces and the light-entrance end face. Therefore, in the case where the one or more semiconductor laser elements are contained in a hermetically sealed CAN package, and the light-entrance end face of the optical fiber is protected by holding the light-entrance end face in contact with a transparent member, the deposition of contaminants enhanced by the high-energy laser beams can be effectively prevented. In addition, the replaceability of the transparent member is also effective in maintaining the reliability of the laser module.

(3) This application is based upon and claims the benefits of priority from the Japanese patent application No. 2005-103782, the contents of which are incorporated herein by reference.

What is claimed is:

1. A laser module comprising:
a chassis having a light-output-window from which one or more laser beams are outputted, and a transparent member holder disposed outside said light-output window, such that said one or more laser beams are transmitted through said transparent member holder;
a hermetically sealed package fixed to said chassis;
one or more semiconductor laser elements which are arranged in said hermetically sealed package, and emit said one or more laser beams;
a transparent member, which is larger than said light-output window and covers said light output window, and is removeably disposed in said transparent member holder;
an optical fiber which has a light-entrance end face, and is arranged outside said chassis so that the light-entrance end face is in contact with a light-output face of said transparent member, wherein said optical fiber is detachably attached to said chassis; and
an optical condensing system which is arranged inside said chassis, and makes said one or more laser beams pass through said transparent member and be condensed on said light-entrance end face;
wherein said light output window is narrower than said transparent member holder, such that a step is formed between said light output window and said transparent member holder by the difference in size therebetween;
wherein, when said transparent member is disposed in said transparent member holder, a light-input face of said transparent member is in contact with said step, thus restricting movement of said transparent member and said optical fiber along the optical axis toward said light output window.

2. A laser module according to claim 1, further comprising a ferrule into which a near-tip portion of said optical fiber including said light-entrance end face is inserted, and said chassis has a receptacle which receives said ferrule.

3. A laser module according to claim 1, wherein said one or more laser beams have an optical power density of 10 W/mm$^2$ or lower at a surface of said transparent member on which the one or more laser beams are incident, opposite the light-output face of said transparent member.

4. A laser module according to claim 2, wherein said one or more laser beams have an optical power density of 10 W/mm$^2$ or lower at a surface of said transparent member on which one or more laser beams are incident, opposite the light-output face of said transparent member.

5. A laser module according to claim 1, wherein said one or more semiconductor laser elements have an oscillation wavelength of 350 to 500 nm.

6. A laser module according to claim 2, wherein said one or more semiconductor laser elements have an oscillation wavelength of 350 to 500 nm.

7. A laser module according to claim 3, wherein said one or more semiconductor laser elements have an oscillation wavelength of 350 to 500 nm.

8. A laser module according to claim 4, wherein said one or more semiconductor laser elements have an oscillation wavelength of 350 to 500 nm.

* * * * *